(12) United States Patent
Ichikawa et al.

(10) Patent No.: US 12,355,012 B2
(45) Date of Patent: Jul. 8, 2025

(54) CERAMIC-INSULATED MULTI-METAL SUBSTRATE STRUCTURE WITH INTEGRATED COATING FILM FOR HIGH-PERFORMANCE LIGHT-EMITTING DEVICES

(71) Applicant: Stanley Electric Co., Ltd., Tokyo (JP)

(72) Inventors: Koji Ichikawa, Tokyo-to (JP); Hiroshi Nakai, Tokyo-to (JP)

(73) Assignee: STANLEY ELECTRIC CO., LTD., Tokyo (JP)

( * ) Notice: Subject to any disclaimer, the term of this patent is extended or adjusted under 35 U.S.C. 154(b) by 353 days.

(21) Appl. No.: 17/705,495

(22) Filed: Mar. 28, 2022

(65) Prior Publication Data

US 2022/0328461 A1    Oct. 13, 2022

(30) Foreign Application Priority Data

Feb. 5, 2021    (JP) .................................. 2021-17175

(51) Int. Cl.
*H01L 25/075*    (2006.01)
*H10H 20/01*    (2025.01)
(Continued)

(52) U.S. Cl.
CPC ......... *H01L 25/0753* (2013.01); *H10H 20/01* (2025.01); *H10H 20/8312* (2025.01);
(Continued)

(58) Field of Classification Search
CPC . H01L 25/0753; H01L 33/005; H01L 33/382; H01L 33/46; H01L 33/505;
(Continued)

(56) References Cited

U.S. PATENT DOCUMENTS 8,900,893 B2 * 12/2014 Wang .................. H10H 20/857
438/26
2004/0038519 A1    2/2004 Yanagisawa et al.
(Continued)

FOREIGN PATENT DOCUMENTS

JP        03-127796 U       12/1991
JP        2002-185024 A     6/2002
(Continued)

OTHER PUBLICATIONS

Japanese Office Action issued Aug. 6, 2024 in corresponding Japanese Patent Application No. 2021-017175, 19 pages.
(Continued)

*Primary Examiner* — Caleb E Henry
(74) *Attorney, Agent, or Firm* — XSENSUS LLP

(57) ABSTRACT

A light-emitting device of the present invention includes a plurality of substrates, an insulating portion, and an insulating upper surface coating film. The plurality of metal substrates are placed side by side to be separated from one another. The insulating portion is made of ceramic and fills the clearance. The insulating upper surface coating film is formed so as to integrally cover respective one substrate surfaces of the plurality of substrates and has an opening portion that spreads over the one substrate surface of one substrate among the plurality of substrates and the one substrate surface of another substrate adjacent to the one substrate across the clearance. The opening portion exposes an element placing region for placing an element.

17 Claims, 8 Drawing Sheets

(51) Int. Cl.
    *H10H 20/831*     (2025.01)
    *H10H 20/841*     (2025.01)
    *H10H 20/851*     (2025.01)

(52) U.S. Cl.
    CPC ...... *H10H 20/841* (2025.01); *H10H 20/8514* (2025.01); *H10H 20/034* (2025.01)

(58) Field of Classification Search
    CPC ........... H01L 2933/0025; H01L 33/486; H01L 2933/0066; H01L 33/62; H01L 33/647; H01L 2933/0075; H01L 33/44; H01L 2933/0091; H10H 20/01; H10H 20/8312; H10H 20/841; H10H 20/8514; H10H 20/034; H10H 20/857; H10H 20/0364; H10H 20/0365; H10H 20/8585; H10H 20/8506; H10H 20/84; H10H 20/882
    See application file for complete search history.

(56) References Cited

U.S. PATENT DOCUMENTS

| | | | |
|---|---|---|---|
| 2007/0187706 A1* | 8/2007 | Higashi | H10H 20/856 257/E33.072 |
| 2009/0022198 A1 | 1/2009 | Chen et al. | |
| 2009/0261374 A1* | 10/2009 | Hayashi | H01L 33/62 257/E33.001 |
| 2010/0096642 A1 | 4/2010 | Chang et al. | |
| 2010/0133565 A1* | 6/2010 | Cho | H01L 33/60 257/E33.001 |
| 2011/0193056 A1* | 8/2011 | Wang | H10H 20/814 257/E33.056 |
| 2011/0297986 A1* | 12/2011 | Nishiuchi | H01L 33/0093 257/98 |
| 2011/0303941 A1* | 12/2011 | Lee | H01L 33/486 257/98 |
| 2012/0267654 A1* | 10/2012 | Lee | H01L 33/62 257/E25.02 |
| 2012/0311856 A1 | 12/2012 | Yoshimura | |
| 2013/0121000 A1* | 5/2013 | Lee | H01L 33/56 362/293 |
| 2016/0013378 A1* | 1/2016 | Sakamoto | H10H 20/857 438/26 |
| 2019/0172984 A1 | 6/2019 | Higashino et al. | |
| 2019/0333896 A1* | 10/2019 | Song | H01L 25/0753 |
| 2019/0334063 A1* | 10/2019 | Kim | H01L 25/0753 |
| 2020/0098963 A1* | 3/2020 | Maeda | H01L 33/62 |
| 2020/0279982 A1* | 9/2020 | Lim | H01L 33/62 |
| 2020/0303596 A1* | 9/2020 | Lim | H01L 33/60 |

FOREIGN PATENT DOCUMENTS

| | | |
|---|---|---|
| JP | 2002-313914 A | 10/2002 |
| JP | 2009-027166 A | 2/2009 |
| JP | 2011-108688 A | 6/2011 |
| JP | 2012-039120 A | 2/2012 |
| JP | 2019-42678 A | 3/2019 |
| JP | 2019-087549 A | 6/2019 |
| JP | 2019-102636 A | 6/2019 |
| JP | 2020536370 A | 12/2020 |
| WO | 2016/067794 A1 | 5/2016 |

OTHER PUBLICATIONS

Japanese Office Action issued Jan. 21, 2025 in corresponding Japanese Patent Application No. 2021-017175, 18 pages.

* cited by examiner

CERAMIC-INSULATED MULTI-METAL SUBSTRATE STRUCTURE WITH INTEGRATED COATING FILM FOR HIGH-PERFORMANCE LIGHT-EMITTING DEVICES

CROSS-REFERENCE TO RELATED APPLICATION

The present application claims priority to Japanese Patent Application 2021-17175, filed Feb. 5, 2021, the entire contents of which are incorporated herein by reference.

BACKGROUND

1. Technical Field

The present invention relates to a substrate structure, a light-emitting device, and a manufacturing method of the substrate structure.

2. Description of the Related Art

There has been known a light-emitting device in which a light-emitting element, such as a Light Emitting Diode (LED) and a Laser Diode (LD), is used as a light source.

For example, JP-A-2019-042678 discloses a busbar assembly in which first and second busbars made of conductive metal flat plates are mutually electrically insulated and mechanically connected by an insulating resin layer. Further, a technique in which a first plated layer and a second plated layer respectively disposed in the first and second busbars are electrically connected to a positive electrode and a negative electrode of a semiconductor element, respectively.

However, in the busbar assembly disclosed in JP-A-2019-042678, mechanical strength of a connecting part of the insulating resin layer that connects the first and second busbars to one another is low, and a failure, such as breakage and bend, of the connecting part may occur during manufacturing of a semiconductor device.

Further, in the busbar assembly disclosed in JP-A-2019-042678, since the connecting part is made of resin having a low coefficient of thermal conductivity, heat generated from a light-emitting element connected on the first busbar might not be sufficiently transferred to the second busbar, and heat dissipation of the light-emitting element may be insufficient.

The present invention has been made in consideration of the above points, and an object of the present invention is to provide a substrate structure that has high mechanical strength and high heat dissipation by connecting a plurality of metal flat plates with ceramic, a light-emitting device, and a manufacturing method of the substrate structure.

A substrate structure of the present invention includes a plurality of substrates, an insulating portion, and an insulating upper surface coating film. The plurality of substrates are placed side by side to be separated from one another with a clearance interposed therebetween and are each made of metal. The insulating portion is made of ceramic that is formed so as to fill the clearance. The insulating upper surface coating film is formed so as to integrally cover respective one substrate surfaces of the plurality of substrates and has an opening portion that spreads over the one substrate surface of one substrate among the plurality of substrates and the one substrate surface of another substrate adjacent to the one substrate across the clearance. The opening portion exposes an element placing region for placing an element.

A light-emitting device of the present invention includes a substrate structure and a plurality of light-emitting elements. The substrate structure includes a plurality of substrates that are placed side by side to be separated from one another with a clearance interposed therebetween and are each made of metal, an insulating portion made of ceramic that is formed so as to fill the clearance, and an insulating upper surface coating film formed so as to integrally cover respective one substrate surfaces of the plurality of substrates and having an opening portion that spreads over the one substrate surface of one substrate among the plurality of substrates and the one substrate surface of another substrate adjacent to the one substrate across the clearance. The opening portion exposes an element placing region for placing an element. The plurality of light-emitting elements arranged in a region exposed by the opening portion.

A manufacturing method of a substrate structure of the present includes: preparing a substrate base material made of metal; forming an upper surface coating film so as to cover one substrate surface of the substrate base material; dividing the substrate base material into a plurality of substrates from a surface facing the one substrate surface so as to be placed side by side to be separated from one another with a clearance interposed therebetween; forming an insulating portion made of ceramic in the clearance between the respective plurality of substrates; and forming an opening portion in the upper surface coating film, the opening portion spreading over the one substrate surface of one substrate among the plurality of substrates and the one substrate surface of another substrate adjacent to the one substrate across the clearance, the opening portion exposing an element placing region for placing an element.

DETAILED DESCRIPTION

Figure 1:
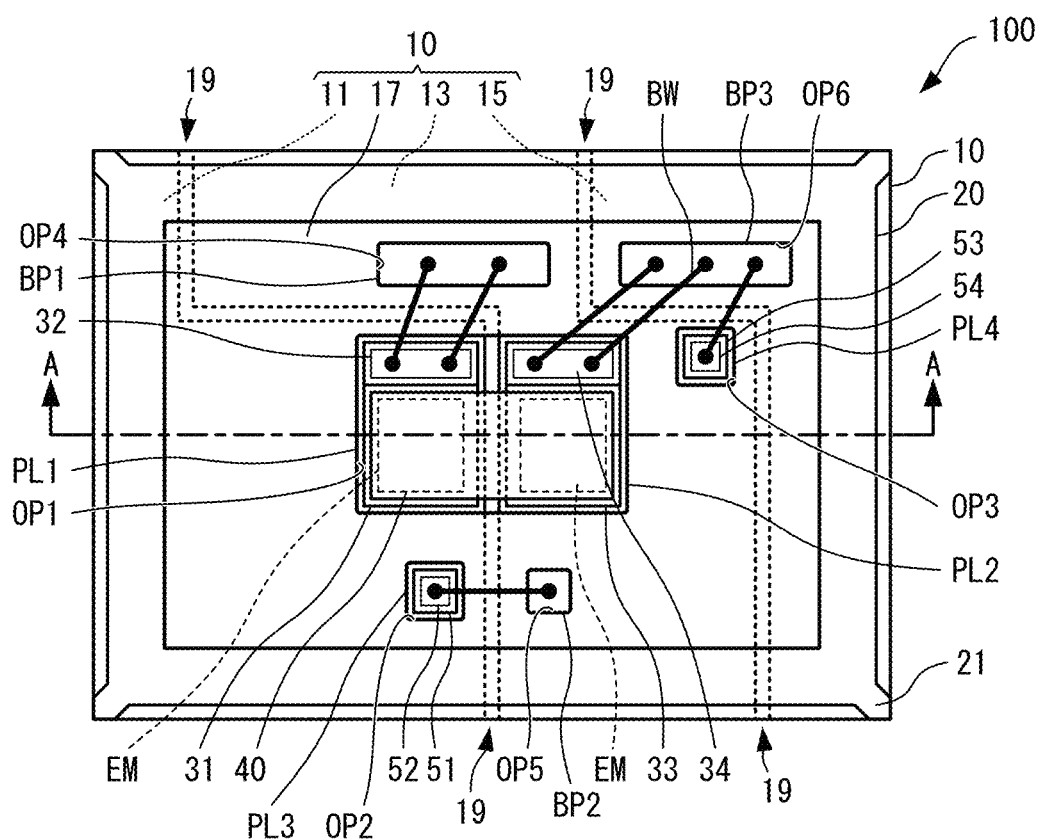
FIG. 1 is a top view of a light-emitting device according to an embodiment of the present invention.

An embodiment of the present invention will be described in detail below. Note that the same reference numerals are given to substantially the same or equivalent parts in the following description and the accompanying drawings. In the following description, a description of "material 1/material 2" means a laminated structure in which a material 2 is laminated on a material 1. A description of "material 1-material 2" means an alloy of materials 1 and 2, and a description of "material 1-material 2-material 3" or "material 1 material 2 material 3" means an alloy of materials 1 to 3.

Embodiment

Figure 2:
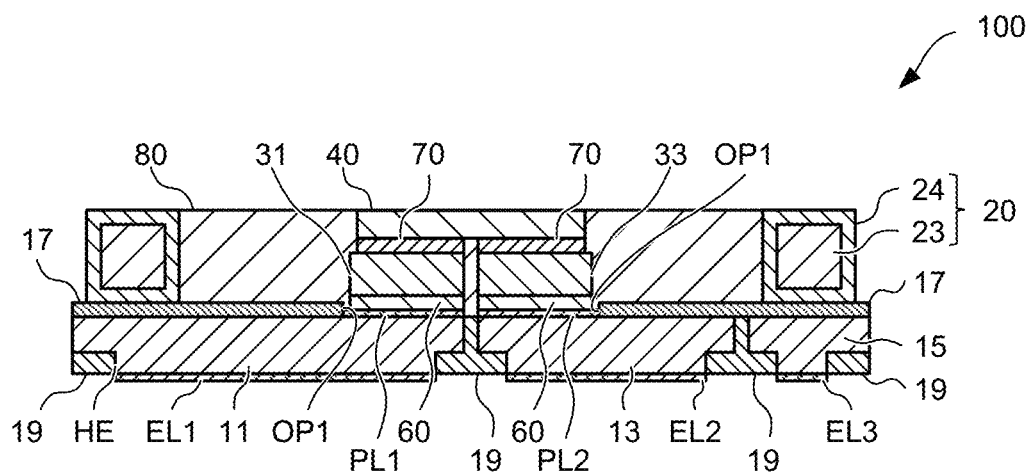
FIG. 2 is a cross-sectional view of the light-emitting device along the line A-A in FIG. 1.

FIG. 1 illustrates a schematic top view of a light-emitting device 100. FIG. 2 illustrates a cross-sectional view along the line A-A of the light-emitting device 100 in FIG. 1.

As illustrated in FIG. 1 and FIG. 2, the light-emitting device 100 has a composite substrate 10 as a substrate structure that includes, for example, a first substrate 11, a second substrate 13, and a third substrate 15 that are plate-shaped, an upper surface coating film 17, and insulating portions 19. The first substrate 11, the second substrate 13, and the third substrate 15 are made of metal and placed side by side to be separated from one another with a clearance. The upper surface coating film 17 is formed so as to cover the respective upper surfaces of the respective substrates. The insulating portions 19 are buried in clearance regions between one another of the respective substrates.

Further, the light-emitting device 100 has a frame body 20 that is disposed on the outer peripheral portion on the upper surface of the composite substrate 10 and composed of a frame base material 23 and a frame body coating film 24.

Further, the light-emitting device 100 has, for example, a first light-emitting element 31, a second light-emitting element 33, a wavelength converter 40, and first and second protection elements 51 and 53. The first light-emitting element 31 is placed on an element placing portion PL1 formed on the first substrate 11. The second light-emitting element 33 is placed on an element placing portion PL2 formed on the second substrate 13. The wavelength converter 40 is placed so as to cover respective light-emitting portions EM over the first light-emitting element 31 and the second light-emitting element 33. The first and second protection elements 51 and 53 are placed on element placing portions PL3 and PL4 formed on the first substrate 11 and the second substrate 13.

Further, the light-emitting device 100 has a coating member 80 as a filler that is filled so as to expose the upper surface, which is a light extraction surface, of the wavelength converter 40 placed so as to cover the respective light-emitting portions EM over the respective upper surfaces of the first light-emitting element 31 and the second light-emitting element 33. In FIG. 1, in order to clarify a structure and a positional relationship of each component, the coating member 80 is omitted.

The first substrate 11, the second substrate 13, and the third substrate 15 are metal flat plates made of, for example, a metallic material, such as copper (Cu). The first substrate 11, the second substrate 13, and the third substrate 15 have, for example, mutually complementary shapes in adjacent parts. Further, the first substrate 11, the second substrate 13, and the third substrate 15 are conductors having a function of electrically connecting to a mounting board (not illustrated). In the embodiment, while a case where the main material of the first substrate 11, the second substrate 13, and the third substrate 15 is Cu is described, the material is not limited to this. For example, it is only necessary for the material to have a conductive property and high thermal conductivity, such as iron (Fe), aluminum (Al), iron-nickel (Fe—Ni) alloy, and iron-cobalt (Fe—Co) alloy. In other words, the composite substrate 10 includes the first substrate 11, the second substrate 13, and the third substrate 15 that are placed side by side to be separated from one another with clearances interposed therebetween and are each made of metal. For the first substrate 11, the second substrate 13, and the third substrate 15, an alloy containing copper, aluminum, iron or any one or more metals may be used.

The upper surface coating film 17 is made of an insulating resin and formed so as to integrally cover the respective upper surfaces of the first substrate 11, the second substrate 13, and the third substrate 15. The upper surface coating film 17 is, for example, an insulating preform sheet made of a polyimide resin sheet and a thermoplastic polyimide resin film (TPI) having adhesiveness. In the upper surface coating film 17, the polyimide resin sheet is thermally press-bonded over to the respective upper surfaces of the first substrate 11, the second substrate 13, and the third substrate 15 via TPI. That is, the first substrate 11, the second substrate 13, and the third substrate 15 are bound by the upper surface coating film 17 formed on the upper surfaces of the respective substrates. In other words, the composite substrate 10 includes the upper surface coating filth 17 formed so as to integrally cover respective one substrate surfaces of the first substrate 11, the second substrate 13, and the third substrate 15. The upper surface coating film 17 is a polyimide resin preliminarily formed in a sheet shape.

Note that the upper surface coating film 17 is not limited to an insulating polyimide resin preliminarily formed in a sheet shape. The upper surface coating film 17 may be, for example, a polyimide resin formed by applying a polyimide precursor (polyamic acid) that is bound to a substrate to become a polyimide resin (PI) sheet by baking at a high temperature. It is only necessary for the upper surface coating film 17 to be made of a material or by a forming method that allows maintaining the clearances of the first substrate 11, the second substrate 13, and the third substrate 15, and to be made of a resin material having thermal resistance so as not to be peeled from the respective substrates in heating, such as in element bonding.

The insulating portion 19 is made of, for example, ceramic that is an insulating inorganic compound, and is filled in the clearance regions between one another of the respective substrates from the lower surface sides of the respective substrates. The insulating portion 19 binds facing side surfaces of the adjacent substrates to one another in the clearance region. In other words, the composite substrate 10 includes the insulating portions 19 made of ceramic which is formed so as to fill the clearances.

The insulating portion 19 is an insulating ceramic made of, for example, ceramic containing alumina ($Al_2O_3$), titania ($TiO_2$), chromic ($Cr_2O_3$), yttria ($Y_2O_3$), or zirconia ($ZrO_2$), which is formed by ceramic spraying as the main component. In other words, the insulating portion 19 is a ceramic sprayed film.

Further, the insulating portion 19 is a ceramic made of, for example, metal silicate in which an inorganic adhesive containing a binder of metallic silicate, a filler (aggregate) of metal oxide, and a curing agent of hydroxide or the like of metal oxide as the main raw materials is cured. The binder is, for example, an aqueous solution containing a hydrate of silicate of alkali metal (for example, $M_2SiO_3$aq, where M is alkali metal), such as sodium (Na), potassium (K), or lithium (Li). The filler is, for example, a ceramic made of metal oxide, such as alumina, zirconia, or silica ($SiO_2$). The curing agent is, for example, a metallic hydroxide, such as zinc oxide hydroxide ($ZnO·H_2O$), magnesium oxide hydroxide ($MgO·H_2O$), and calcium oxide hydroxide ($CaO·H_2O$). By filling the clearances with the above inorganic adhesive and then heating, the inorganic adhesive develops a dehydration condensation reaction and eventually turns into the ceramic insulating portion 19 made of polymer (glass body) having a siloxane bond containing the filler. In other words, the insulating portion 19 is a reaction cured product of the inorganic adhesive.

The curing agent referred to here is an auxiliary curing agent, and the reaction cured product is produced only with the binder and the filler. By selecting a metal oxide having a high coefficient of thermal conductivity for the filler, the coefficient of thermal conductivity of the reaction cured product can be increased.

The inorganic adhesive used for the insulating portion 19 is not limited to the above. The inorganic adhesive used for the insulating portion 19 may be, for example, an inorganic adhesive containing an aqueous solution containing phosphate (for example, $M·H_2PO_4$, where M is metal), such as aluminum (Al), magnesium (Mg), calcium (Ca), iron (Fe), copper (Cu), barium (Ba), titanium (Ti), or manganese (Mn), as the main raw material. Further, the inorganic adhesive used for the insulating portion 19 may be an inorganic adhesive containing a colloidal solution (colloidal silica) containing metal ions and silica as the main raw material or may be an inorganic adhesive containing a metallic alkoxide in which alcohol is used as a solvent as the main raw material. It is only necessary to select an inorganic adhesive that turns into a ceramic-based inorganic compound having a high coefficient of thermal conductivity and high thermal resistance after it is cured for the inorganic adhesive used for the insulating portion 19.

In the embodiment, a case where the main component of ceramic is $Al_2O_3$ when the insulating portion 19 is a ceramic sprayed film formed by ceramic spraying is described. Further, a case where sodium silicate ($Na_2SiO_3$aq) is used as the binder, $Al_2O_3$ is used as the filler, and $ZnO·H_2O$ is used as the curing agent when the insulating portion 19 contains an inorganic adhesive as the raw material is described.

That is, the first substrate 11, the second substrate 13, and the third substrate 15 as the substrates of the composite substrate 10 are integrally bound by the upper surface coating film 17 on the respective upper surfaces and by the insulating portions 19 formed in the clearance regions. As described above, the upper surface coating film 17 and the insulating portion 19 have an insulating property. Accordingly, the first substrate 11, the second substrate 13, and the third substrate 15 are electrically insulated from one another.

The insulating portion 19 formed by the above method is a ceramic having thermal resistance of 800° C. or higher regardless of a composition.

The upper surface coating film 17 has an opening portion OP1 that collectively opens regions that are opposed to one another with the insulating portion 19 interposed between end portions of the respective facing sides of the first substrate 11 and the second substrate 13. The opening portion OP1 is opened so as to pass through the upper surface coating film 17 from the upper surface in the regions. That is, the opening portion OP1 is opened so that the upper surfaces of the first substrate 11 and the second substrate 13 and the upper surface of the insulating portion 19 are exposed in an inside that is opened. At this time, the region of the first substrate 11 exposed in the opening portion OP1 becomes a region on which the first light-emitting element 31 is placed, and the region of the second substrate 13 becomes a region on which the second light-emitting element 33 is placed. In other words, the composite substrate 10 includes the insulating upper surface coating film 17 having the opening portion OP1 that spreads over the one substrate surface of the first substrate 11 among the first substrate 11, the second substrate 13, and the third substrate 15 and the one substrate surface of the second substrate 13 adjacent to the first substrate 11 across the clearance and exposes element placing regions for placing the elements.

The element placing portions PL1 and PL2 as placing pads are respectively formed on the respective upper surfaces of the first substrate 11 and the second substrate 13 exposed in the opening portion OP1.

The upper surface coating film 17 has opening portions OP2 and OP3 that are opened so as to pass through to the upper surfaces of the first substrate 11 and the second substrate 13 in a region on the first substrate 11, on which the first protection element 51 is placed, and a region on the second substrate 13, on which the second protection element 53 is placed. Similarly to the element placing portions PL1 and PL2, the element placing portions PL3 and PL4 as placing pads are disposed in insides of the opening portions OP2 and OP3.

The upper surface coating film 17 has an opening portion OP4 that is opened so as to pass through from the upper surface of the upper surface coating film 17 to the upper surface of the second substrate 13 in a region on the upper surface of the second substrate 13 opposed to the element placing portion PL1 with the insulating portion 19 interposed therebetween. A bonding pad BP1 is formed in an inside of the opening portion OP4. Further, the upper surface coating film 17 has an opening portion OP5 that is opened so as to pass through from the upper surface of the upper surface coating film 17 to the upper surface of the second substrate 13 in a region on the upper surface of the second substrate 13 opposed to the element placing portion PL3 with the insulating portion 19 interposed therebetween. A bonding pad BP2 is formed in an inside of the opening OP5. Further, the upper surface coating film 17 has an opening portion OP6 that is opened so as to pass through from the upper surface of the upper surface coating film 17 to the upper surface of the third substrate 15 in a region on the upper surface of the third substrate 15 opposed to the element placing portions PL2 and PL4 with the insulating portion 19 interposed therebetween. A bonding pad BP3 is formed in an inside of the opening portion OP6.

Each of the element placing portions PL1 to PL4 and the bonding pads BP1 to BP3 is, for example, a conductive metallic film formed by electroplating, in which nickel/gold (Ni/Au) is sequentially laminated from the upper surface of each of the substrates. As described above, since the insulating portion 19 is an insulating ceramic, the metallic film by electroplating is not formed on the upper surface of the insulating portion 19 exposed in the opening portion OP1. That is, the element placing portions PL1 and PL2 are electrically insulated from one another.

The element placing portions PL1 and PL2 function as the two placing pads on which the first and second light-emitting elements 31 and 33 are placed. Accordingly, the first substrate 11 and the second substrate 13 function as element placing substrates on which the two first and second light-emitting elements 31 and 33 are placed. The element placing portions PL3 and PL4 function as the two placing pads on which the first protection element 51 and the second protection element 53 are placed, respectively.

On the lower surfaces of the first substrate 11, the second substrate 13, and the third substrate 15, external electrodes EL1, EL2 and EL3 are formed, respectively. The external electrodes EL1, EL2 and EL3 are, for example, conductive metallic films formed by electroplating, in which nickel/gold (Ni/Au) is sequentially laminated. The external electrodes EL1, EL2 and EL3 function as, for example, external electrodes electrically connected to a mounting board by soldering or the like. That is, in the composite substrate 10, the surfaces being the lower surfaces, on which the external electrodes EL1, EL2 and EL3 are formed, function as mounting surfaces of the light-emitting device 100.

The respective opening portions are formed by irradiating a laser from the upper side of the upper surface coating film 17 and removing the upper surface coating film 17 in the regions of the respective opening portions. That is, in the opening portion OP1, the region including the insulating portion 19 is opened. If the insulating portion 19 is made of a resin material similarly to the upper surface coating film 17, there is a possibility that, when the opening portion OP1 is formed, the insulating portion 19 is damaged by a laser light and a hole is opened, or the insulating portion 19 is peeled from the first substrate 11 and the second substrate 13, leaking the coating member 80. However, as described above, the insulating portion 19 is a material made of ceramic having very high thermal resistance and thermal conductivity. Accordingly, the opening portion OP1 can be formed without ally problem without the insulating portion 19 being damaged or melted by heat due to laser irradiation in forming the opening portion OP1.

The frame body 20 has outer peripheral edges of respective sides that are arranged inside with respect to the outer peripheral edges of the composite substrate 10 in top view. Further, the frame body 20 has frame body extending portions 21 that are extended from the apexes of the four corners of the frame body 20 to the apexes of the four corners of the composite substrate 10. The frame body extending portions 21 are arranged at positions separated from the insulating portions 19 of the composite substrate 10 in top view. In other words, the light-emitting device 100 further includes the frame body 20 that is bonded on the upper surface of the composite substrate 10 via the upper surface coating film 17 and stretches on the upper surface of the composite substrate 10 along the peripheral area of the composite substrate 10.

The frame base material 23 is made of, for example, a material identical to that of the first substrate 11, the second substrate 13, and the third substrate 15. The frame body coating film 24 is, for example, a resin material made of polyimide (P1). The frame body coating film 24 is formed by, for example, thermal curing after applying a precursor that becomes the frame body coating film 24 and coats the frame base material 23 at least on the bottom surface portion of the frame base material 23 around the whole circumference. That is, the composite substrate 10 and the frame body 20 are electrically insulated from one another.

The frame body 20 is bound to the composite substrate 10 by pressurizing and heating. That is, the frame body 20 and the composite substrate 10 are bound by the frame body coating film 24 and the upper surface coating film 17.

The light-emitting device 100 has a U-shaped cavity opened toward the upper side, which is formed by the composite substrate 10 and the frame body 20.

In the embodiment, while a case where the first substrate 11, the second substrate 13, and the frame base material 23 are made of an identical material is described, the first substrate 11, the second substrate 13, and the frame base material 23 do not have to be made of an identical material. Further, since it is only necessary for the frame body 20 to be insulated from the composite substrate 10, only the frame base material 23 may be formed without forming the frame body coating film 24.

For the frame body 20, for example, a ceramic made of metal oxide, such as glass, alumina, and zirconia, or metal nitride, such as aluminum nitride, and silicon nitride may be used.

Furthermore, for the frame body 20, for example, a molded frame body 20 of silicon resin, epoxy resin, acrylic resin, polycarbonate resin, polyimide resin, or the like may be used. In this case, the frame body 20 can adhere to the composite substrate 10 via an adhesive (a liquid adhesive, a sheet-shaped resin prepreg or the like). The frame body 20 made of the above resin material may be formed on the upper surface of the composite substrate 10 by insert molding or the like.

The first light-emitting element 31 and the second light-emitting element 33 are, for example, semiconductor light-emitting elements each having the light-emitting portion EM as a semiconductor light-emitting layer laminated on supporting substrates made of a conductive semiconductor as the main material. The light-emitting portion EM is composed of, for example, a structure in which a p-type semiconductor layer, a light-emitting layer, and an n-type semiconductor layer are laminated. The upper surface of the n-type semiconductor layer is each of the upper surfaces of the light-emitting portions EM and functions as a light extraction surface in each of the light-emitting elements. The p-type semiconductor layer, the light-emitting layer, and the n-type semiconductor layer are, for example, nitride semiconductors made of gallium nitride (GaN) or the like as the main material and blue color light-emitting diodes (LED) that radiate blue light from the light-emitting layers having a multiple quantum well structure. The lower surfaces of the first light-emitting element 31 and the second light-emitting element 33 are electrically connected to the p-type semiconductor layers via the supporting substrates, and the lower surfaces of the first light-emitting element 31 and the second light-emitting element 33 function as cathode electrodes (not illustrated).

Further, the first light-emitting element 31 and the second light-emitting element 33 are respectively bonded on the element placing portions PL1 and PL2 formed on the respective upper surfaces of the first substrate 11 and the second substrate 13 via conductive element bonding layers 60 so as to be arrayed in a predetermined direction. That is, the cathode electrode being the lower surface of the first light-emitting element 31 is electrically connected to the first substrate 11 via the element bonding layer 60 and the element placing portion PL1, and the cathode electrode being the lower surface of the second light-emitting element 33 is electrically connected to the second substrate 13 via the element bonding layer 60 and the element placing portion PL2.

Further, the first light-emitting element 31 and the second light-emitting element 33 respectively have electrode pads 32 and 34 formed so as to be separated from the light-emitting portions EM on the supporting substrates. The electrode pads 32 and 34 are electrically connected to the p-type semiconductor layers of the respective light-emitting portions EM and function as anode electrodes of the first and second light-emitting elements 31 and 33. The electrode pad 32 of the first light-emitting element 31 is, for example, electrically connected to the bonding pad BP1 formed on the second substrate 13 via conductive bonding wires BW made of gold (Au). The electrode pad 34 of the second light-emitting element 33 is, for example, electrically connected to the bonding pad BP3 formed on the third substrate 15 via the conductive bonding wires BW made of Au. In other words, the first light-emitting element 31 and the second light-emitting element 33 respectively have the respective supporting substrates, the semiconductor layers including the light-emitting portions EM being the light-emitting layers formed on the respective upper surfaces of the supporting substrates, and the electrode pads 32 and 34 formed on the supporting substrates.

As described above, the element bonding layer 60 as a bonding member is a conductive adhesive that fixedly secures and electrically connects the first and second light-emitting elements 31 and 33 respectively to the element placing portions PL1 and PL2. The element bonding layer 60 is, for example, a gold-tin alloy (AuSn alloy). Further, the element bonding layer 60 is, for example, a paste-like adhesive made of AuSn alloy particles and flux as the raw materials (hereinafter, the raw materials of the element bonding layer 60 may be simply referred to as an AuSn paste). In the embodiment, while a case where the element bonding layer 60 is made of the AuSn alloy is described, the element bonding layer 60 is not limited to this. For example, the element bonding layer 60 may be an argentum (Ag) paste or a solder paste. The element bonding layer 60 is preferably a conductive adhesive having non-affinity to the upper surface coating film 17. The element bonding layer 60 having non-affinity to the upper surface coating film 17 allows easily performing self-alignment when the element bonding layer 60 is melted.

Further, for example, for the element bonding layer 60, a conductive adhesive made of an AuSn bump, an AuSn sheet, or an AuSn deposition layer, which does not include flux, as the raw material may be used. For example, when the AuSn bump is used as the raw material of the element bonding layer 60, it becomes possible to temporarily bond the AuSn bump on any of the cathode electrodes (not illustrated) of the lower surfaces of the first and second light-emitting elements 31 and 33 or the upper surfaces of the element placing portion PL1 and the element placing portion PL2, and to bond the first and second light-emitting elements 31 and 33 while adjusting bonding positions with a bonding apparatus. The above method is similarly possible when the AuSn sheet is used as the raw material of the element bonding layer 60. Further, for example, when the AuSn deposition layer is used as the raw material of the element bonding layer 60, it becomes possible to form the AuSn deposition layer by vapor deposition on any of the cathode electrodes (not illustrated) of the lower surfaces of the first and second light-emitting elements 31 and 33 or the upper surfaces of the element placing portion PL1 and the element placing portion PL2, and to bond the first and second light-emitting elements 31 and 33 while adjusting bonding positions with a bonding apparatus.

The first and second protection elements 51 and 53 are, for example, reverse voltage protection elements, such as a zener diode. When an overvoltage is applied to the first and second light-emitting elements 31 and 33 from outside (such as, static electricity), the first and second protection elements 51 and 53 operate so as to protect the respective light-emitting elements. The first and second protection elements 51 and 53 have, for example, electrode pads 52 and 54 that function as cathode electrodes on the upper surfaces of the elements, respectively, and anode electrodes on the lower surfaces of the elements. Further, similarly to that described above, the anode electrodes of the first and second protection elements 51 and 53 are respectively bonded on the element placing portions PL3 and PL4 formed in the opening portions OP2 and OP3 of the upper surface coating film 17 on the respective upper surfaces of the first substrate 11 and the second substrate 13 via the element bonding layers 60. That is, the anode electrode of the first protection element 51 is electrically connected to the first substrate 11, and the anode electrode of the second protection element 53 is electrically connected to the second substrate 13. The electrode pad 52 formed on the upper surface of the first protection element 51 is electrically connected to the second substrate 13 via the bonding wire BW and the bonding pad BP2. The electrode pad 54 formed on the upper surface of the second protection element 53 is electrically connected to the third substrate 15 via the bonding wire BW and the bonding pad BP3. That is, the first protection element 51 is connected in parallel and in a reversed polarity to the first light-emitting element 31, and the second protection element 53 is connected in parallel and in a reversed polarity to the second light-emitting element 33.

In the first and second light-emitting elements 31 and 33 and the first and second protection elements 51 and 53, the bonding wire BW is configured by an aspect of what is called reverse bonding made of a wire bump and a gold wire. In the embodiment, while a case where the bonding wire BW is configured by reverse bonding is described, the aspect of the bonding wire BW is not limited to this and may be an aspect of forward bonding in which press-bonded balls are formed on the respective electrode pads.

That is, the first light-emitting element 31 is connected in parallel to the first protection element 51 between the external electrodes EL1 and EL2, and the second light-emitting element 33 is connected in parallel to the second protection element 53 between the external electrodes EL2 and EL3. In the embodiment, a case where the external electrode EL2 electrically floats on the mounting board is described. That is, in the light-emitting device 100, a voltage is applied between the external electrodes EL1 and EL3. In other words, the light-emitting device 100 is in an aspect in which, between the external electrodes EL1 and EL3, the first light-emitting element 31 and the first protection element 51 that are connected in parallel to one another are connected in series to the second light-emitting element 33 and the second protection element 53 that are connected in parallel to one another. Therefore, in the light-emitting device 100, the external electrode EL1 functions as the cathode electrode, and the external electrode EL3 functions as the anode electrode. In this respect, the external electrode EL2 functions as a heatsink thermally connected to the mounting board.

The wavelength converter 40 is arranged so as to extend over the respective upper surfaces of the first light-emitting element 31 and the second light-emitting element 33. The wavelength converter 40 is fixedly secured by adhesive resins 70 formed on the respective upper surfaces of the first light-emitting element 31 and the second light-emitting element 33. The wavelength converter 40 performs wavelength conversion to emitted light from the first and second light-emitting elements 31 and 33. In other words, the light-emitting device 100 further includes the wavelength converter 40 that extends over the first light-emitting element 31 and the second light-emitting element 33.

The wavelength converter 40 is formed of a plate-shaped member containing, for example, phosphor particles made of yttrium aluminum garnet (YAG:Ce, $Y_3Al_5O_{12}$:Ce) having doped cerium (Ce) as the main material and a binder of glass or ceramic of alumina or the like that transmits radiation light of the first and second light-emitting elements 31 and 33 and radiation light of the phosphor particles. As the binder, YAG having non-doped cerium (Ce) may be used (in this case, the wavelength converter 40 may be a polycrystal body or a single crystal body). As the phosphor contained in the wavelength converter 40, other than YAG, a phosphor of Ce-doped gallium yttrium aluminum garnet (GYAG:Ce, $Y_3(Al,Ga)_5O_{12}$:Ce), Ce-doped lutetium aluminum garnet (LuAG:Ce, $Lu_3Al_5O_{12}$:Ce), or the like may be used. Similarly, a phosphor of europium (Eu) and Ca-doped α-SiAlON ($Si_{(12-m-n)}Al_{(m-n)}O_nN_{(16-n)}$:Eu,Ca), Eu-doped β-SiAlON ($Si_{(6-z)}Al_zO_zN_{(8-z)}$:Eu), Eu-doped CASN ($CaAlSiN_3$:Eu), Eu-doped SCASN (($Sr,Ca)AlSiN_3$:Eu), Eu and manganese (Mn)-doped orthosilicate (($Ba,Sr,Mg)_2SiO_4$Eu,Mn), Mn-doped KFS ($K_2SiF_6$:Mn), or the like may be used. The additive amount or kind of the above phosphor may be appropriately selected depending on the color of light that the light-emitting device 100 radiates. A plurality of kinds of the above phosphors may be combined and used.

In the embodiment, the wavelength converter 40 is a wavelength conversion plate that performs the wavelength conversion of a part of blue light that the first and second light-emitting elements 31 and 33 radiate, combines light that the first and second light-emitting elements 31 and 33 radiate and light that the wavelength converter 40 radiates, and radiates white light. Performing the wavelength conversion of approximately all light that the first and second light-emitting elements 31 and 33 radiate by the wavelength converter 40 allows converting the light radiated from the wavelength converter 40 that is exposed to the outside of the light-emitting device 100 into green light, yellow light, orange light, red light, infrared light, and the like that correspond to the radiation light of the wavelength converter 40.

The wavelength converter 40 has one main surface that is bonded on the upper surfaces of the respective light-emitting elements via the adhesive resins 70 as adhesive resin layers that transmits the light that the respective light-emitting elements radiate. Further, the other main surface faces to the outside of the light-emitting device 100 so as to be exposed. That is, the one main surface of the wavelength converter 40 functions as a light-receiving surface that receives the light emitted by the respective light-emitting elements via the adhesive resins 70, and the other main surface functions as a light extraction surface of the light-emitting device 100.

The coating member 80 is a filler filled in the cavity formed by the composite substrate 10 and the frame body 20.

The coating member 80 is a white resin that reflects the light that the respective light-emitting elements radiate and the light emitted from the wavelength converter 40. In the embodiment, the coating member 80 is a white resin made of, for example, particles having a light scattering property, such as titanium oxide ($TiO_2$), and a thermosetting resin material in which the particles are scattered, such as a silicone resin.

The coating member 80 is filled in the cavity formed by the composite substrate 10 and the frame body 20 and formed so as to cover side surfaces of the first light-emitting element 31, the second light-emitting element 33, and the wavelength converter 40. Further, the coating member 80 is formed so that the upper surface being the light extraction surface of the wavelength converter 40 is exposed. In other words, the light-emitting device 100 further includes the light reflective coating member 80 formed so as to cover the side surfaces of the first light-emitting element 31, the second light-emitting element 33, and the wavelength converter 40.

According to the above, the light-emitting device 100 includes the composite substrate 10, the first light-emitting element 31, and the second light-emitting element 33. The composite substrate 10 includes the first substrate 11, the second substrate 13, the third substrate 15, the insulating portion 19, and the insulating upper surface coating film 17. The first substrate 11, the second substrate 13, the third substrate 15 are placed side by side to be separated from one another with the clearances interposed therebetween and are each made of metal. The insulating portion 19 is made of ceramic that is formed so as to fill the clearances. The upper surface coating film 17 is formed so as to integrally cover the one substrate surfaces of the respective substrates, and has the opening portion OP1 that spreads over the one substrate surface of the first substrate 11 among the first substrate 11, the second substrate 13, and the third substrate 15 and the one substrate surface of the second substrate 13 adjacent to the first substrate 11 across the clearance and exposes the element placing regions on which the first light-emitting element 31 and the second light-emitting element 33 are placed. The first light-emitting element 31 and the second light-emitting element 33 are arranged in the regions exposed by the opening portion OP1.

In the embodiment, the insulating portions 19 made of ceramic are formed in the clearances between the substrates of the first substrate 11, the second substrate 13, and the third substrate 15. The insulating portion 19 is formed of ceramic having high thermal conductivity, thereby allowing the composite substrate 10 to obtain a high heat dissipation property. Specifically, for example, heat generated when the first light-emitting element 31 and the second light-emitting element 33 placed on the first substrate 11 and the second substrate 13 are driven is efficiently conducted to the third substrate 15 via the insulating portions 19. That is, when the light-emitting device 100 is mounted on the mounting board (not illustrated), heat dissipation can be efficiently performed even from the third substrate 15 on which elements are not placed. Therefore, in the present invention, a light-emitting device having high heat dissipation and a manufacturing method of the light-emitting device can be provided.

In the embodiment, each of the first substrate 11, the second substrate 13, and the third substrate 15 has a shape formed of a polygonal shape having an angle formed by mutually adjacent sides of 90° or 270° in top view. That is, the first substrate 11 has a hexagonal upper surface shape having an angle formed by mutually adjacent sides of 90° or 270°, the second substrate 13 has an octagonal upper surface shape having an angle formed by mutually adjacent sides of 90° or 270°, and the third substrate 15 has a hexagonal upper surface shape having an angle formed by mutually adjacent sides of 90° or 270°. In the embodiment, two sides of each of the first substrate 11, the second substrate 13, and the third substrate 15 that face another substrate form an angle of 270°. That is, the clearances between the respective substrates and the insulating portions 19 that fill the clearances have a crank shape in top view.

This can further increase binding areas in which the insulating portions 19 are bound to the respective substrates and further improve binding strength of mutually adjacent substrates. Further, forming the insulating portions 19 in a crank shape allows stress applied to the insulating portions 19 to be dispersed, for example, even when bending stress is applied to the longitudinal direction of the composite substrate 10, and ensures improving bending resistance strength of the composite substrate 10.

In the embodiment, recessed structures HE are disposed on the lower surface sides of the respective side surfaces of the first substrate 11, the second substrate 13, and the third substrate 15. Since this increases the binding areas of the respective substrates and the insulating portions 19, the binding strength of mutually adjacent substrates by the insulating portions 19 can be improved. Furthermore, the composite substrate 10 is held by binding the frame body 20 on the upper surface, thereby ensuring further improving the bending resistance strength. Therefore, in the present invention, a light-emitting device having high mechanical strength and a manufacturing method of the light-emitting device can be provided.

In the composite substrate 10, by providing the recessed structures HE in the respective substrates, respective distances in which the external electrodes EL1, EL2 and EL3 formed on the lower surfaces of the respective substrates are separated can be increased. This can reduce a bonding member, such as solder, which bonds the light-emitting device 100 on the mounting board (not illustrated), being mutually connected between the external electrodes EL1, EL2 and EL3 to cause a short circuit when the light-emitting device 100 is mounted on the mounting board.

In the embodiment, the clearances between the substrates of the first substrate 11, the second substrate 13, and the third substrate 15 are, for example, 0.2 mm. In the embodiment, as illustrated in FIG. 1, the first substrate 11, the second substrate 13, and the third substrate 15 are placed side by side so that the shapes of the mutually adjacent substrates via the clearances are complementary in top view. Further, the first substrate 11, the second substrate 13, and the third substrate 15 have a rectangular upper surface shape in a state of being bound by the upper surface coating film 17 and the insulating portions 19.

The clearances between the respective substrates are not limited to the above dimension and clearances of 0.2 mm or more may be provided. It is only necessary to conveniently set the clearances between the respective substrates within a range that can form the insulating portions 19 and does not cause a problem in rigidity of the insulating portions 19, bonding strength of the insulating portions 19 and the respective substrates, or bending strength after the composite substrate 10 is formed.

The light-emitting device 100 is formed by dicing to individualize a substrate base material in which a plurality of the light-emitting devices 100 are continuously formed in a matrix by a manufacturing method described later. That is, the side surfaces of the composite substrate 10 are dicing cut surfaces. That is, the composite substrate 10 has a structure in which the first substrate 11, the second substrate 13, or the third substrate 15 is exposed to parts excluding the insulating portions 19 on the side surfaces of the respective sides.

This allows confirming a mounting state between the respective substrates and the insulating portions 19 or the upper surface coating film 17 from the side surfaces of the light-emitting device 100 after the light-emitting device 100 is manufactured. After the light-emitting device 100 is manufactured or during the manufacturing process, by bringing a measuring probe into contact with the respective substrates exposed to the side surfaces of the composite substrate 10, an electrical connection state of the first and second light-emitting elements 31 and 33 can be confirmed.

In the embodiment, while a case where the first substrate 11, the second substrate 13, or the third substrate 15 is exposed to all the parts excluding the insulating portions 19 on the side surfaces of the respective sides of the composite substrate 10 is described, each of the substrates does not need to be exposed to all the parts excluding the insulating portions 19. It is only necessary for at least a part of each of the first substrate 11, the second substrate 13, or the third substrate 15 to be exposed on any of the side surfaces of the composite substrate 10. By decreasing areas of each of the substrates exposed on the side surfaces of the composite substrate 10, metal burrs at the time of individualization by dicing in manufacturing of the light-emitting device 100 described later and peeling of the upper surface coating film 17 can be reduced.

Since the frame body extending portions 21 of the frame body 20 pin down the four sides of the composite substrate 10 in dicing, application of stress to the insulating portions 19 of the composite substrate 10 in dicing can be reduced. This can further reduce the peeling of the respective substrates and the upper surface coating film 17 in dicing.

Next, using FIG. 3 and FIGS. 4 to 13, a manufacturing procedure of the light-emitting device 100 according to the embodiment of this application will be described.

Figure 3:
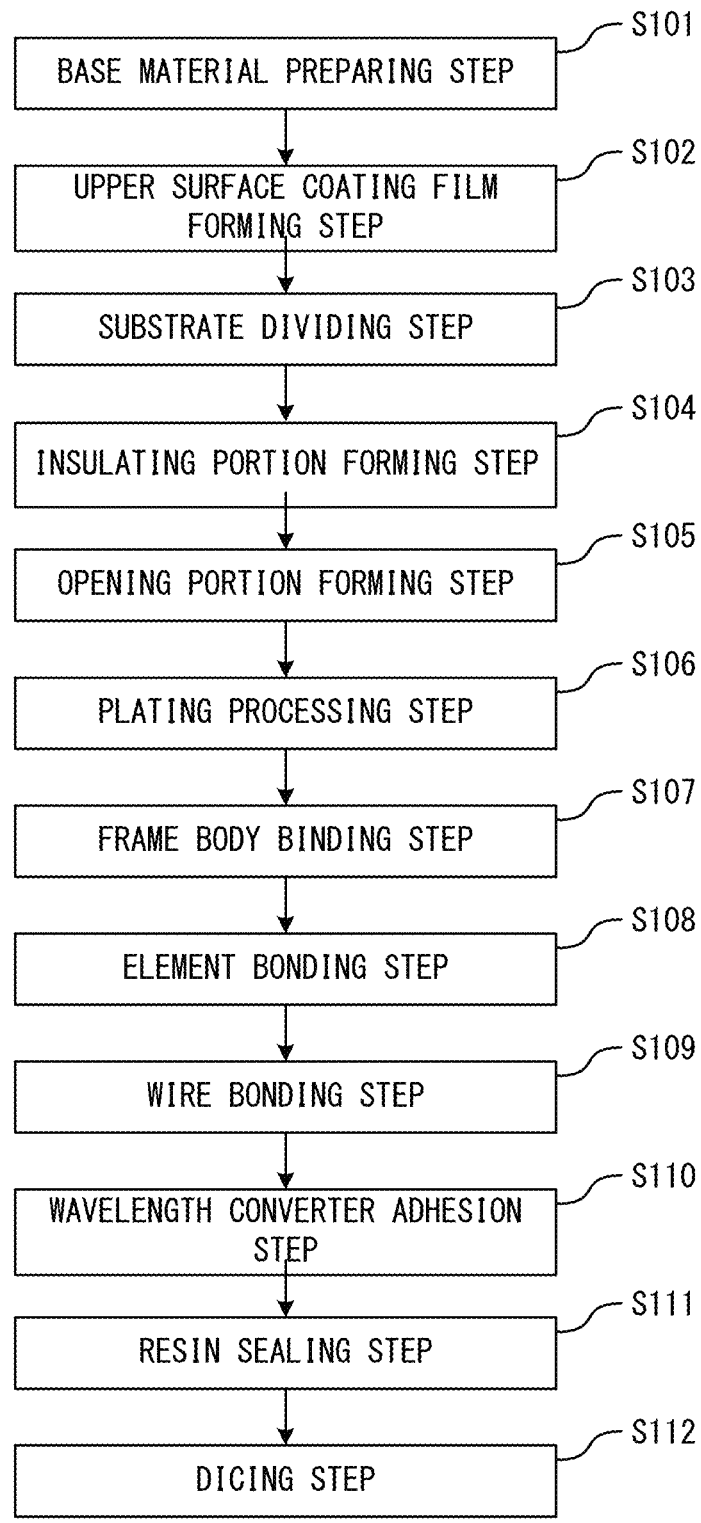
FIG. 3 is a diagram illustrating a manufacturing flow of the light-emitting device according to the embodiment of the present invention.

FIG. 3 is a diagram illustrating a manufacturing flow of the light-emitting device 100 according to the embodiment of the present invention. FIGS. 4 to 13 illustrate cross-sectional views of the light-emitting device 100 at each step of the manufacturing procedure illustrated in FIG. 3. In FIGS. 4 to 13, cross-sectional views along the line A-A of the light-emitting device 100 in FIG. 1 are illustrated. In the manufacturing process of the light-emitting device 100 of the embodiment, a plurality of light-emitting devices are manufactured in a state of being mutually connected in front to back and side to side directions and are individualized at the end to make the light-emitting devices 100. However, in FIGS. 4 to 13, one light-emitting device 100 is illustrated and described.

Figure 4:
FIG. 4 is a cross-sectional view in manufacturing the light-emitting device according to the embodiment of the present invention.

First, as illustrated in FIG. 4, a substrate base material preparing step of preparing a plate-shaped substrate base material 90 (also referred to as a base material) made of Cu is performed (Step S101). In other words, the manufacturing method of the substrate structure includes the substrate base material preparing step of preparing a substrate base material made of metal.

Figure 5:
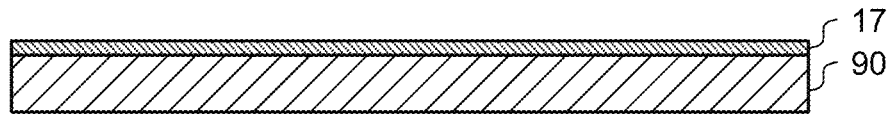
FIG. 5 is a cross-sectional view in manufacturing the light-emitting device according to the embodiment of the present invention.

Next, as illustrated in FIG. 5, an upper surface coating film forming step of forming the upper surface coating film 17 on the upper surface (light-emitting element placing surface) of the substrate base material 90 is performed (Step S102). The upper surface coating film 17 is caused to adhere to the substrate base material 90 by heating the polyimide resin sheet to 350° C. while pressing via the thermoplastic polyimide resin film (TPI) having adhesiveness. In other words, the manufacturing method of the substrate structure includes the upper surface coating film forming step of forming the upper surface coating film 17 so as to cover one substrate surface of the substrate base material 90. In the upper surface coating film forming step, a polyimide resin preliminarily formed in a sheet shape is attached to the one substrate surface of the substrate base material 90 to form the upper surface coating film 17. As described above, the upper surface coating film 17 may be formed by, for example, heating and curing after applying a precursor that becomes a polyimide (P1) resin on the upper surface of the substrate base material 90.

Figure 6:
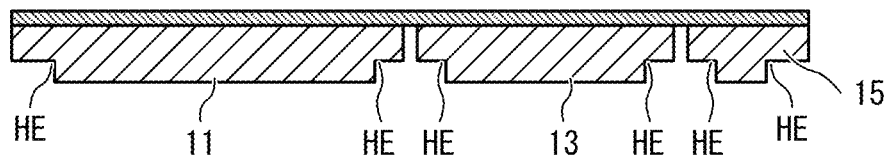
FIG. 6 is a cross-sectional view in manufacturing the light-emitting device according to the embodiment of the present invention.

Next, as illustrated in FIG. 6, a substrate dividing step of dividing the substrate base material 90 into the first substrate 11, the second substrate 13, and the third substrate 15 is performed (Step S103). In this step, first, resist films corresponding to the outer shapes of the upper surface sides of the first substrate 11, the second substrate 13, and the third substrate 15 are formed on the lower surface (external electrode forming surface) of the substrate base material 90, and the substrate base material 90 exposed by an acid solution is half-etched to form grooves having widths at which the upper surfaces of the respective substrates are separated from one another. Next, resist films corresponding to the outer shapes of the lower surface sides of the first substrate 11, the second substrate 13, and the third substrate 15 are re-formed, etching is performed on the substrate base material 90 exposed by the acid solution until the above-described grooves reach the upper surface coating film 17. This divides the substrate base material 90 into the first substrate 11, the second substrate 13, and the third substrate 15, and forms the recessed structures HE on the side surfaces of the respective substrates. In other words, the manufacturing method of the substrate structure includes the substrate dividing step of dividing the substrate base material 90 into the first substrate 11, the second substrate 13, and the third substrate 15 from the surface opposed to the one substrate surface so as to place the first substrate 11, the second substrate 13, and the third substrate 15 side by side to be separated from one another with clearances interposed therebetween.

Figure 7:
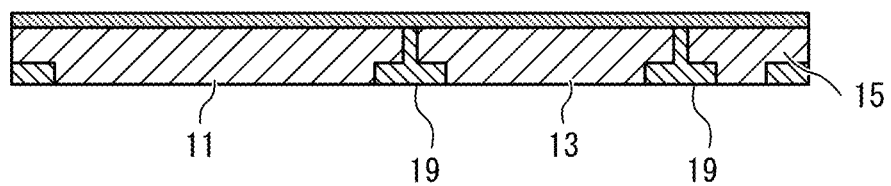
FIG. 7 is a cross-sectional view in manufacturing the light-emitting device according to the embodiment of the present invention.

Next, as illustrated in FIG. 7, an insulating portion forming step of filling the insulating portions 19 in clearance regions including the respective recessed structures HE of the first substrate 11, the second substrate 13, and the third substrate 15 is performed (Step S104). In other words, the manufacturing method of the substrate structure includes the insulating portion forming step of forming the insulating portions 19 made of ceramic in the respective clearances of the first substrate 11, the second substrate 13, and the third substrate 15.

When the insulating portion 19 is a ceramic sprayed film, the insulating portions 19 are formed by providing masks by, for example, a polyimide film or the like on the respective lower surfaces of the first substrate 11, the second substrate 13, and the third substrate 15, and spraying (thermal spraying) molten particles of the insulating portion 19 from the lower surface sides of the respective substrates. The insulating portions 19 are preferably formed so as not to be ejected from the lower surfaces of the respective substrates. In other words, in the insulating portion forming step, the insulating portions 19 are formed by filling the ceramic sprayed film in the clearances by ceramic spraying.

In the embodiment, a case where the thermal-sprayed molten particles are $Al_2O_3$ is described. The thermal spraying method of the insulating portion 19 may be any method of low-pressure plasma spraying, atmospheric plasma spraying, high velocity flame spraying, or ceramic rod flame spraying. For the thermal-sprayed molten particles, another metal oxide may be used. It is only necessary to appropriately select the thermal spraying method or thermal spraying material from the rigidity of the insulating portions 19 after being formed and the bonding strength with the respective substrates within an allowable range of the thermal resistance of the upper surface coating film 17 or the masks. After the sprayed films being the insulating portions 19 are formed, the masks are removed.

When the insulating portion 19 is made of an inorganic adhesive as the raw material, the substrate base material 90 is turned over so that the upper surface coating film 17 serves as the lower surface, and the inorganic adhesive is filled in the clearances and the recessed structures HE of the respective substrates. At this time, the inorganic adhesive is preferably filled so as not to overflow from the clearances and the recessed structures HE. Further, in the embodiment, a case where the filled inorganic adhesive is an inorganic adhesive in which $Al_2O_3$ as the filler and $ZnO \cdot H_2O$ as the curing agent are dispersed in the aqueous solution in which $Na_2SiO_3$ or the like as the binder is dissolved is described. The substrate base material 90 filled with the inorganic adhesive is, for example, after the inorganic adhesive is filled in the clearances and the recessed structures HE of the substrates without gap by ultrasonic treatment, heated for four hours at 80° C. to cure the inorganic adhesive, and the insulating portions 19 are formed. In other words, in the insulating portion forming step, the inorganic adhesive is filled in the clearances and cured to form the insulating portions 19.

As described above, the inorganic adhesive that forms the insulating portion 19 is not limited to this. A silicate aqueous solution containing another alkali metal may be used as the binder, or an inorganic adhesive in which an aqueous solution containing metal phosphate, a colloid solution (colloidal silica) containing metal ion and silica, or metallic alkoxide using alcohol being a solvent is used as the binder may be used. For the filler, another metal oxide or the like may be used. For the curing agent, another metallic hydroxide or the like may be used. It is only necessary to appropriately select the inorganic adhesive from the rigidity of the insulating portions 19 after being formed and the bonding strength with the respective substrates.

Before the insulating portions 19 are formed, fine unevenness is preferably provided on the surfaces of the clearances and the recessed structures HE of the respective substrates. This can improve the binding strength between the respective substrates and the insulating portions 19. The unevenness can be formed by, for example, sand-blasting, laser irradiation, or the like.

Figure 8:
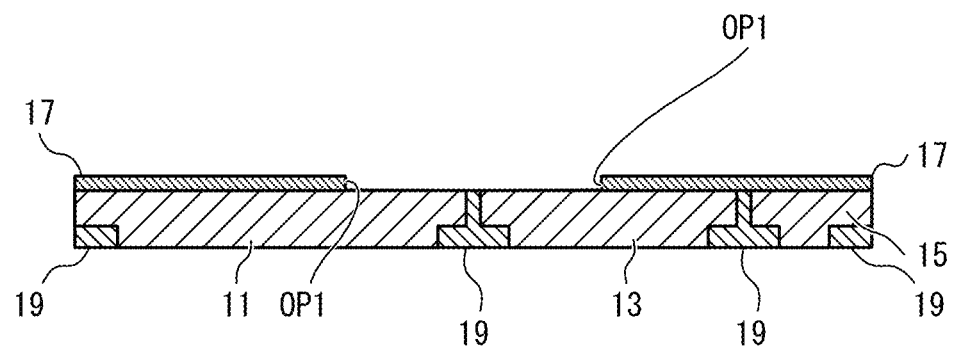
FIG. 8 is a cross-sectional view in manufacturing the light-emitting device according to the embodiment of the present invention.

Next, as illustrated in FIG. 8, an opening portion forming step of turning over the substrate base material 90 again so that the upper surface coating film 17 serves as the upper surface, irradiating a laser from the upper side to remove the upper surface coating film 17, and forming the opening portions OP1 to OP6 (Step S105). The laser irradiated to the upper surface coating film 17 is, for example, a laser light, such as Yttrium Aluminum Garnet (YAG). In this step, as described above, in the opening portion OP1, the regions on the upper surface coating film 17 that are opposed to one another with the insulating portion 19 interposed between the end portions of the respective facing sides of the first substrate 11 and the second substrate 13 are collectively opened. That is, in this step, in the regions where the opening portion OP1 is opened, the upper surfaces of the first substrate 11 and the second substrate 13 and the upper surface of the insulating portion 19 are opened so as to be exposed. In other words, the manufacturing method of the substrate structure includes the opening portion forming step of forming the opening portion OP1 in the upper surface coating film 17. The opening portion OP1 spreads over the one substrate surface of the first substrate 11 among the first substrate 11, the second substrate 13, and the third substrate 15 and the one substrate surface of the second substrate 13 adjacent to the first substrate 11 across the clearance and exposes the element placing regions on which the first light-emitting element 31 and the second light-emitting element 33 are placed. Further, in the opening portion forming step, the laser is irradiated from the one substrate surface to the upper surface coating film 17 to form the opening portions OP1 to OP6.

For the laser irradiated to the upper surface coating film 17, the irradiated laser type is not limited to this. Specifically, it is only necessary to be able to remove the polyimide resin being the upper surface coating film 17 by irradiating a laser. As described above, since the insulating portion 19 is a ceramic having very high thermal resistance and thermal conductivity, the insulating portion 19 is not damaged or melted by the heat due to laser irradiation in forming the opening portion OP1.

Figure 9:
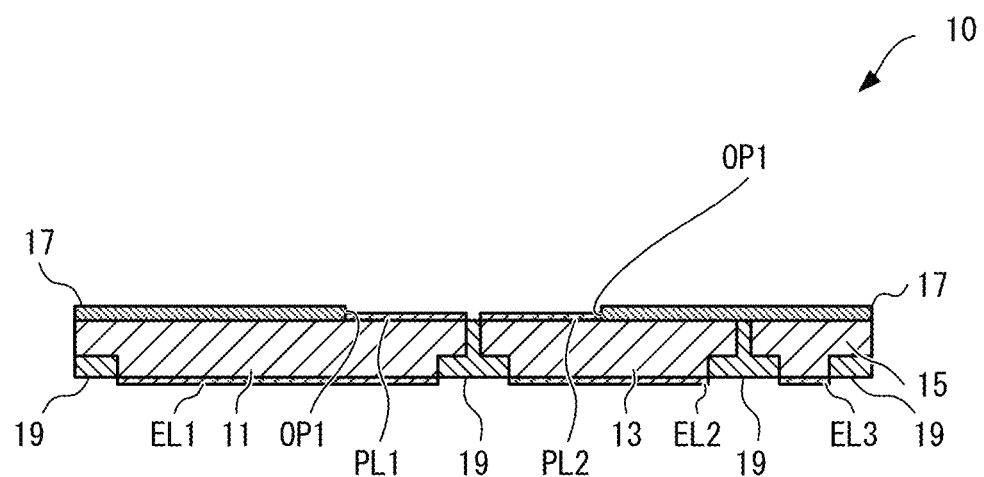
FIG. 9 is a cross-sectional view in manufacturing the light-emitting device according to the embodiment of the present invention.

Next, as illustrated in FIG. 9, plating processing is performed on the substrate base material 90 on which laser processing has been performed to form the element placing portions PL1 to PL4 made of Ni/Au and the bonding pads BP1 to BP3 on the opening portions OP1 to OP6 and the external electrodes EL1 to EL3 (Step S106). In the embodiment, the plating processing performed on the substrate base material 90 is electroplating. As described above, since the insulating portion 19 is an insulating ceramic, the metallic film by the electroplating is not formed on the upper surface of the insulating portion 19 exposed in the opening portion OP1. That is, the element placing portions PL1 and PL2 are electrically insulated from one another.

By performing the steps of Step S101 to S106 described above, the composite substrate 10 is manufactured.

Figure 10:
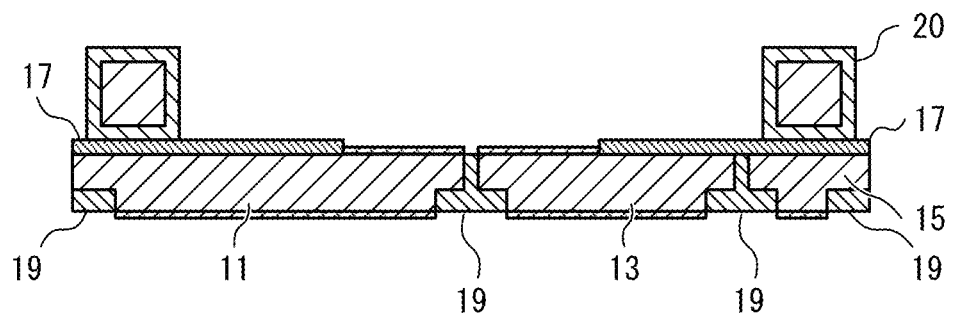
FIG. 10 is a cross-sectional view in manufacturing the light-emitting device according to the embodiment of the present invention.

Next, as illustrated in FIG. 10, the frame body 20 is press-bonded to the composite substrate 10 (Step S107). In the frame body 20, the frame body coating film 24 made of PI is preliminary formed on the frame base material 23 by applying and heat-curing. After the frame body 20 is positioned along the outer peripheral portion of the upper surface of the composite substrate 10, the composite substrate 10 and the frame body 20 are heated and pressurized to be press-bonded. The composite substrate 10 and the frame body 20 can be press-bonded via TPI as a thermoplastic resin.

Figure 11:
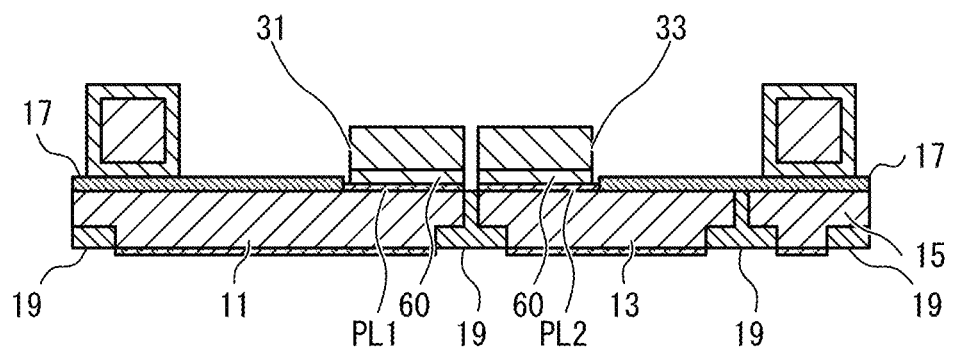
FIG. 11 is a cross-sectional view in manufacturing the light-emitting device according to the embodiment of the present invention.

Next, as illustrated in FIG. 11, an AuSn paste that is a raw material of the element bonding layer 60 is applied on each of the upper surfaces of the element placing portions PL1 to PL4, and the first light-emitting element 31, the second light-emitting element 33, the first protection element 51, and the second protection element 53 are placed on the AuSn pastes (Step S108.) When the AuSn pastes are applied on the respective upper surfaces of the element placing portions PL1 to PL4, it is preferred to apply using a dispenser filled with the AuSn pastes. In this step, the first and second light-emitting elements 31 and 33 are placed on the respective element placing portions so that the respective cathode electrodes (not illustrated) disposed on the lower surfaces of the first and second light-emitting elements 31 and 33 come in contact with the respective AuSn pastes that become the element bonding layers 60. In this step, the first and second protection elements 51 and 53 are placed on the respective element placing portions so that the respective anode electrodes (not illustrated) disposed on the lower surfaces of the first and second protection elements 51 and 53 come in contact with the respective AuSn pastes that become the element bonding layers 60.

By heating the composite substrate 10 in this slate, for example, up to 300° C. in a nitrogen atmosphere to cause AuSn alloy particles in the AuSn pastes to be melted and then cooling the composite substrate 10, the element bonding layers 60 are formed. This causes the first and second light-emitting elements 31 and 33 and the first and second protection elements 51 and 53 to be fixedly secured to the element placing portions PL1 to PL4, respectively, by the element bonding layers 60. Further, the element placing portions PL1 to PL4 and the respective elements are eutectically bonded to one another by the element bonding layers 60 being the AuSn alloy and are electrically connected to one another.

As described above, the position and the orientation where the respective elements are fixed are self-aligned by a surface tension of the molten element bonding layers 60. Specifically, between the heated and molten element bonding layers 60 and the respective elements placed on the element bonding layers 60, the respective elements are self-aligned by the surface tension where an interfacial energy of the molten element bonding layers 60 becomes a minimum. This causes the cathode electrode of the first light-emitting element 31 to be electrically connected to the external electrode EL1. Further, the anode electrode of the first protection element 51 is electrically connected to the external electrode EL1.

Since the upper surface coating film 17 made of P1 has thermal resistance to a temperature higher than the temperature at the time of the eutectic bonding of the AuSn alloy, abnormalities, such as degeneration, do not occur even at the time of the above-described forming of the element bonding layers 60. Further, since the insulating portion 19 made of ceramic has thermal resistance to a temperature higher than the temperature at the time of the eutectic bonding of the AuSn alloy, abnormalities, such as degeneration, do not occur even at the time of the above-described forming of the element bonding layers 60.

In the embodiment, while a case where the element bonding layer 60 is a paste-like adhesive made of AuSn alloy and flux is described, the element bonding layer 60 is not limited to this. For the element bonding layer 60, a conductive adhesive made of an AuSn bump, an AuSn sheet, or an AuSn deposition layer preliminary formed on the lower surface of each of the elements, which does not include flux, as the raw material may be used.

Next, as illustrated in FIG. 11 and FIG. 1, the composite substrate 10 to which the respective elements are fixedly secured is set in a wire bonding device, and the electrode pads of the respective elements are connected to the respective corresponding bonding pads with the bonding wires BW, such as an AU wire (Step S109). Specifically, in this step, the electrode pad 32 of the first light-emitting element 31 is connected to the bonding pad BP1, the electrode pad 52 of the first protection element 51 is connected to the bonding pad BP2, and the electrode pad 34 of the second light-emitting element 33 and the electrode pad 54 of the second protection element 53 are connected to the bonding pad BP3. The connection by the AU wire may be the aspect of forward bonding in which press-bonded balls are formed on the electrode pads of the respective elements, or may be the aspect of reverse bonding in which, after wire bumps are formed on the respective electrode pads, the press-bonded balls are formed on the respective bonding pads and connected to the respective wire bumps. This causes the anode electrode of the first light-emitting element 31 and the cathode electrode of the first protection element 51 to be electrically connected to the cathode electrode of the second light-emitting element 33 and the anode electrode of the second protection element 53. Further, the anode electrode of the second light-emitting element 33 and the cathode electrode of the second protection element 53 are electrically connected to the external electrode EL3.

Figure 12:
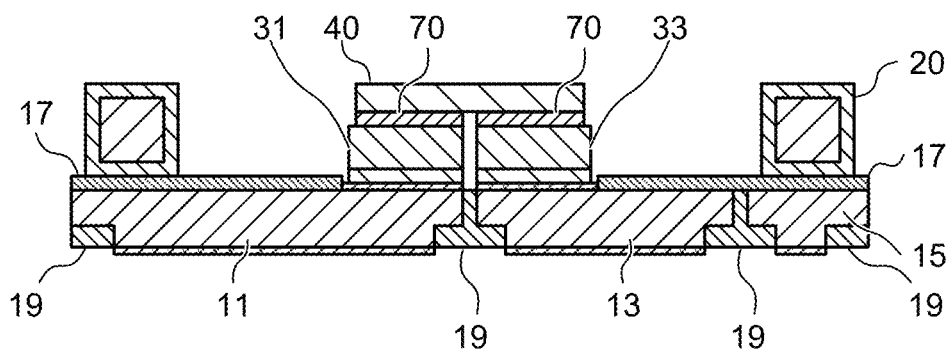
FIG. 12 is a cross-sectional view in manufacturing the light-emitting device according to the embodiment of the present invention.

Next, as illustrated in FIG. 12, as a wavelength converter placing step, after the adhesive resins 70 are applied on the respective light-emitting portions EM of the first and second light-emitting elements 31 and 33, the wavelength converter 40 is placed so as to cover the respective light-emitting portions EM on the adhesive resins 70 (Step S110). The adhesive resin 70 is preferably potted on, for example, the center position or the like of the light-emitting portion EM by a dispenser. The placing position of the wavelength converter 40 is self-aligned to a position where the surface tensions of the adhesive resins 70 on the first and second light-emitting elements 31 and 33 are balanced. Afterwards, the composite substrate 10 in which the wavelength converter 40 is placed on the upper surfaces of the first and second light-emitting elements 31 and 33 is heated to cure the adhesive resins 70, and the wavelength converter 40 is fixedly secured on the upper surfaces of the respective light-emitting elements.

Figure 13:
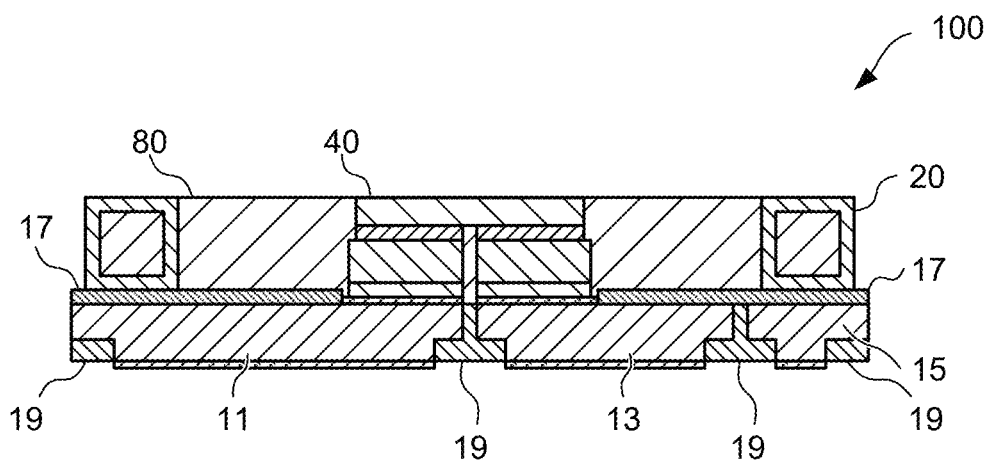
FIG. 13 is a cross-sectional view in manufacturing the light-emitting device according to the embodiment of the present invention.

Next, as illustrated in FIG. 13 and FIG. 1, the reflective coating member 80 is filled inside the cavity formed by the composite substrate 10 and the frame body 20 (Step S111). In this step, for example, in order to fill the coating member 80 in the clearance (region to which the upper surface of the insulating portion 19 is exposed) between the facing side surfaces of the first light-emitting element 31 and the second light-emitting element 33, the coating member 80 is potted on one side of the clearance. The potting position may be from the light-emitting portion EM side (lower side in the drawing) of the clearance or from the electrode pads 32 and 34 side (upper side in the drawing). The coating member 80 is introduced into the clearance by the surface tension, and the coating member 80 is sufficiently filled inside the clearance. Afterwards, the coating member 80 is potted so as to surround the wavelength converter 40, and the reflective coating member 80 is filled inside the cavity formed by the composite substrate 10 and the frame body 20. Afterwards, the composite substrate 10 filled with the coating member 80 is heated to cure the coating member 80. By performing the above-mentioned Step S101 to S111, a plurality of the light-emitting devices 100 coupled in a matrix are formed.

Afterwards, the light-emitting devices 100 coupled in up and down and side to side directions are cut into individual units by dicing, and the light-emitting device 100 is manufactured (Step S112). As described above, this causes base material metals of the first substrate 11, the second substrate 13, and the third substrate 15 to be exposed on the side surfaces of the light-emitting device 100 being dicing cut surfaces. Specifically, the side surfaces of the composite substrate 10 are side surfaces in which the cut surfaces of the base material metals of the respective substrates (11, 13, 15) are sandwiched by the cut surfaces of the upper surface coating film 17 and the insulating portions 19. As described above, the cut surfaces of the respective substrates serve as electrodes that come in contact with an electrode probe for confirming the binding state of the upper surface coating film 17, confirming the binding state of the insulating portions 19, and measuring the electric property and optical property of the light-emitting device 100.

With the embodiment, the light-emitting device 100 has the composite substrate 10 that includes the plate-shaped first substrate 11, the second substrate 13, and the third substrate 15 that are made of metal and placed side by side to be separated from one another, and the insulating upper surface coating film 17 that covers the upper surfaces of first substrate 11, the second substrate 13, and the third substrate 15. The first substrate 11, the second substrate 13, and the third substrate 15 are bound to one another by the insulating portions 19 made of ceramic filled in the clearance regions between the mutually facing side surfaces. The mutually adjacent substrates are bound to one another by the insulating portion 19 made of ceramic having high thermal conductivity. This allows heat generated from the respective light-emitting elements to be efficiently conducted in the composite substrate 10, and the composite substrate 10 to obtain a high heat dissipation property. Therefore, with the present invention, a light-emitting device having a high heat dissipation property and high mechanical strength and a manufacturing method of the light-emitting device can be provided by connecting a plurality of metal flat plates by ceramic.

In the embodiment, a case where the respective light-emitting elements are light-emitting elements that have the cathode electrodes formed on the lower surfaces of the supporting substrates and the anode electrodes formed on the upper surfaces is described. However, the form of the light-emitting elements is not limited to this.

Figure 14:
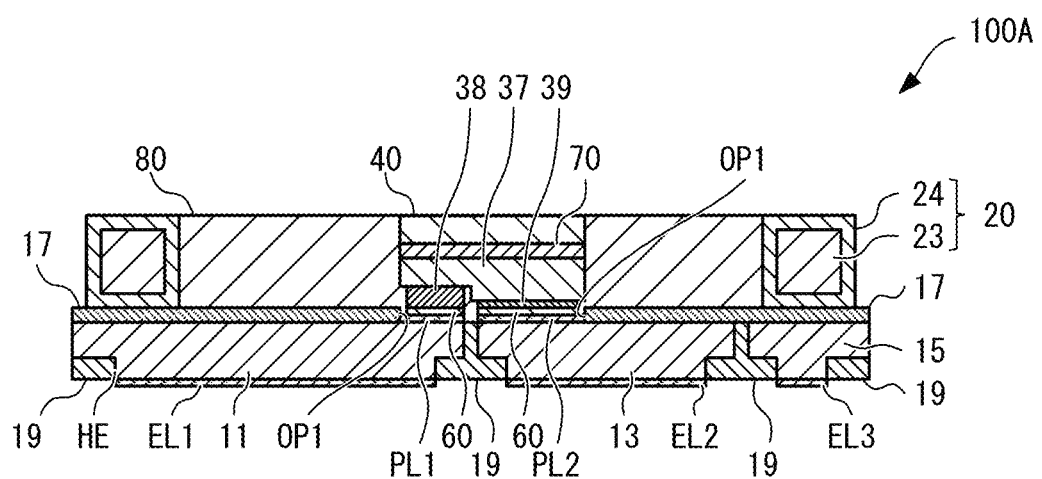
FIG. 14 is a cross-sectional view of a light-emitting device according to a modification of the embodiment of the present invention.

FIG. 14 is a cross-sectional view of a light-emitting device 100A according to a modification of the embodiment. FIG. 14 is a cross-sectional view at a position corresponding to the line A-A of the top view illustrated in FIG. 1.

In the light-emitting device 100A, the basic configuration is similar to that of the embodiment. The light-emitting device 100A is different from the light-emitting device 100 in a point that a mounted element is a light-emitting element 37 in a form of a flip chip having a cathode electrode and an anode electrode formed to be separated from one another on the lower surface of a supporting substrate.

The light-emitting element 37 is an LED radiating blue light that has a structure in which, for example, an n-type semiconductor layer, a light-emitting layer, and a p-type semiconductor layer that are made of a nitride semiconductor containing GaN or the like as the main material are laminated on a translucent growth substrate. On the n-type semiconductor layer, a pillar type metal electrode 38 as a cathode electrode is formed. On the p-type semiconductor layer, a metal electrode 39 as an anode electrode is formed.

After the light-emitting element 37 is formed as described above, the light-emitting element 37 is inverted and mounted on the element placing surface of the composite substrate 10. That is, the light-emitting element 37 is placed in a direction that the metal electrode 38 and the metal electrode 39 are opposed to the element placing surface of the composite substrate 10. In the light-emitting element 37, the upper surface (surface on which the semiconductor layers and the light-emitting layer are not laminated) of the supporting substrate after being placed functions as a light extraction surface in the light-emitting element 37.

In the light-emitting element 37, for example, the metal electrode 38 being the cathode electrode is connected to the element placing portion PL1 of the opening portion OP1 and the metal electrode 39 being the anode electrode is connected to the element placing portion PL2 of the opening portion OP1. That is, the light-emitting element 37 is connected so as be mounted over the first substrate 11 and the second substrate 13 in the opening portion OP1. The light-emitting element 37 can be bonded by a method similar to that of the embodiment.

Thus, the composite substrate 10 and the light-emitting device 100A in which the composite substrate 10 is used are also applicable when the light-emitting element 37 in the form of a flip chip is used and allow having a high heat dissipation property and high mechanical strength.

The manufacturing method of the light-emitting device according to the embodiment and the modification is merely one example and is not limited to the method described above. For example, when a thermoplastic resin is used for the upper surface coating film 17, the resin may be heated and melted, uniformly spread on a metal substrate, and cooled and solidified to be formed.

In the embodiment and the modification, a case where each light-emitting element is a blue LED the main material of which is the nitride semiconductor is described. However, the material of the light-emitting portion EM is not limited to this, and semiconductor light-emitting layers of various LEDs and lasers that radiate the light of other colors are applicable.

In the embodiment and the modification, the light-emitting device that includes the wavelength converter 40 including the phosphor that is excited by the light radiated by each light-emitting element and performs the wavelength conversion of the radiation light is described. However, the wavelength converter 40 may be a light projection plate that does not include the phosphor and does not perform the wavelength conversion of the light radiated by each light-emitting element.

When using the wavelength converter 40 that contains the phosphor performing the wavelength conversion, it is only necessary that, regarding the color of the radiation light of each light-emitting element and the color of the light for which the wavelength converter 40 performs the wavelength conversion, the material of each light-emitting element, the material of the phosphor contained in the wavelength converter 40, and the contained amount of the phosphor are appropriately selected such that the color of the light radiated from the light-emitting device 100 becomes the desired color.

In the embodiment, while the wavelength converter 40 that covers both upper surfaces of the first and second light-emitting elements 31 and 33 is described, the wavelength converter 40 may be a wavelength converter that individually covers each upper surface of the first and second light-emitting elements 31 and 33. Each wavelength converter may be a wavelength converter individually having a different light-emitting wavelength or material.

In the embodiment, a case where, in the light-emitting device, the two first and second light-emitting elements 31 and 33 are mounted so as to be connected in series to one another on the composite substrate 10 configured of the first, second, and third substrates 11, 13 and 15 electrically divided into three is described. However, the count of electrically dividing the composite substrate 10 and the count of the mounted light-emitting elements are not limited to these. In the composite substrate 10, two substrates may be bound by the upper surface coating film 17 and the insulating portion 19 to mount one or more light-emitting elements, or four or more substrates may be bound by the upper surface coating film 17 and the insulating portions 19 to mount three or more light-emitting elements. Further, the structure may be such that four or more substrates are bound by the upper surface coating film 17 and the insulating portions 19 to light respective two light-emitting elements in parallel.

In the embodiment, a case of the light-emitting device in which the external electrode EL2 electrically floats and the first and second light-emitting elements 31 and 33 are connected in series to one another is described. However, the external electrode EL2 may be connected to a mounting board circuit, an electric potential difference may be generated between the external electrodes EL1 and EL2 and between the external electrodes EL2 and EL3, and the first light-emitting element 31 and the second light-emitting element 33 may be made to individually emit light.

In the embodiment, a case where each substrate has a shape formed of a polygonal shape having an angle formed by mutually adjacent sides of 90° or 270° in top view is described. However, the form of each substrate is not limited to the above form. For example, each substrate may have a rectangular upper surface shape or may have an upper surface shape partially formed by a curved line. It is only necessary for at least an end portion of a region where the first and second light-emitting elements 31 and 33 are arranged at an end portion of each substrate to be a straight line. Further, it is only necessary to be able to form the insulating portions 19 in the clearances between the respective substrates without any problem and select appropriately considering the mechanical strength and the heat dissipation property of the composite substrate 10.

It is understood that the foregoing description and accompanying drawings set forth the preferred embodiments of the present invention at the present time. Various modifications, additions and alternative designs will, of course, become apparent to those skilled in the art in light of the foregoing teachings without departing from the spirit and scope of the disclosed invention. Thus, it should be appreciated that the present invention is not limited to the disclosed Examples but may be practiced within the full scope of the appended claims. This application is based upon and claims the benefit of priority from the prior Japanese Patent Application No. 2021-17175 filed on Feb. 5, 2021, the entire contents of which are incorporated herein by reference.

What is claimed is:
1. A substrate structure comprising:
a plurality of substrates that are placed side by side to be separated from one another with a clearance interposed therebetween and are each made of metal;
an insulating portion made of ceramic that is formed so as to fill the clearance; and
an insulating upper surface coating film formed so as to integrate the plurality of substrates and integrally cover the upper surfaces of the plurality of substrates and having an opening portion that spreads over the upper surface of one substrate among the plurality of substrates and the upper surface of another substrate adjacent to the one substrate across the clearance, the opening portion exposing an element placing region for placing an element,
wherein the planar shape of the integrated substrates is a rectangle, the plurality of substrates are made of copper or an alloy with copper as a main material, the insulating portion is made of glass body having a siloxane bond and containing the metal oxide of alumina, zirconia, or silica, the clearances between the respective substrates and the insulating portions that fill the clearances have a crank shape in top view, and the edges of the bottom surface of the substrates along the clear- ances are recessed so that the binding areas between the respective substrates and the insulating portions are increased.

2. The substrate structure according to claim 1, wherein the insulating upper surface coating film is a polyimide resin.

3. A light-emitting device comprising:
a substrate structure including a plurality of substrates that are placed side by side to be separated from one another with a clearance interposed therebetween and are each made of metal, an insulating portion made of ceramic that is formed so as to fill the clearance, and an insulating upper surface coating film formed so as to integrally cover the upper surfaces of the plurality of substrates and having an opening portion that spreads over the upper surface of one substrate among the plurality of substrates and the upper surface of another substrate adjacent to the one substrate across the clearance, the opening portion exposing an element placing region for placing an element; and
a plurality of light-emitting elements arranged in a region exposed by the opening portion,
wherein the planar shape of the substrate structure is a rectangle, the plurality of substrates are made of copper or an alloy with copper as a main material, the insulating portion is made of glass body having a siloxane bond and containing the metal oxide of alumina, zirconia, or silica, the clearances between the respective substrates and the insulating portions that fill the clearances have a crank shape in top view, and the edges of the bottom surface of the substrates along the clearances are recessed so that the binding areas between the respective substrates and the insulating portions are increased.

4. The light-emitting device according to claim 3, wherein the insulating upper surface coating film covers outer peripheral edge of the upper surface of the substrate structure, the light-emitting device comprises a frame body mounted on the surface coating film and formed along outer peripheral edge of the upper surface of the substrate structure.

5. The light-emitting device according to claim 3, wherein the plurality of light-emitting elements each include a supporting substrate, a semiconductor layer including a light-emitting layer formed on each upper surface of the supporting substrates, and an electrode formed on the supporting substrate.

6. The light-emitting device according to claim 3, further comprising:
a wavelength converter extending across the plurality of light-emitting elements; and
a light reflective filler formed so as to cover side surfaces of the plurality of light-emitting elements and the wavelength converter.

7. A manufacturing method of the substrate structure according to claim 1, comprising:
preparing a substrate base material made of copper or an alloy with copper as a main material;
forming the insulating upper surface coating film so as to cover the upper surface of the substrate base material;
dividing the substrate base material into a plurality of substrates from a surface facing the upper surface so as to be placed side by side to be separated from one another with a clearance interposed therebetween;
forming an insulating portion made of ceramic in the clearance between the respective plurality of substrates; and
forming an opening portion in the insulating upper surface coating film, the opening portion spreading over the one substrate surface of one substrate among the plurality of substrates and the one substrate surface of another substrate adjacent to the one substrate across the clearance, the opening portion exposing an element placing region for placing an element.

8. The manufacturing method of a substrate structure according to claim 7, wherein
the forming of the insulating upper surface coating film includes attaching a polyimide resin preliminarily formed in a sheet shape to the one substrate surface of the substrate base material to form the insulating upper surface coating film.

9. The manufacturing method of a substrate structure according to claim 7, wherein
the forming of the insulating portion includes forming the insulating portion by filling a ceramic sprayed film in the clearance by ceramic spraying.

10. The manufacturing method of a substrate structure according to claim 7, wherein
the forming of the insulating portion includes filling and curing an inorganic adhesive in the clearance to form the insulating portion.

11. The manufacturing method of a substrate structure according to claim 8, wherein
the forming of the opening portion includes irradiating a laser from the one substrate surface to the insulating upper surface coating film to form the opening portion.

12. The light-emitting device according to claim 1, a fine unevenness is provided on the sides of the respective substrates facing the clearance.

13. The light-emitting device according to claim 4, wherein the plurality of light-emitting elements each include a supporting substrate, a semiconductor layer including a light-emitting layer formed on each upper surface of the supporting substrates, and an electrode formed on the supporting substrate.

14. The light-emitting device according to claim 12, further comprising:
a wavelength converter extending across the plurality of light-emitting elements; and
a light reflective filler formed so as to cover side surfaces of the plurality of light-emitting elements and the wavelength converter.

15. The light-emitting device according to claim 3, a fine unevenness is provided on the sides of the respective substrates facing the clearance.

16. The light-emitting device according to claim 4, the outer peripheral edge of the frame body is arranged inside the outer peripheral edge of the substrate structure and spaced from the outer peripheral edge of the substrate structure except for the corners so that the frame body has extending portions extended from the four corners of the frame body to the four corners of the substrate structure.

17. The light-emitting device according to claim 12, the outer peripheral edge of the frame body is arranged inside the outer peripheral edge of the substrate structure and spaced from the outer peripheral edge of the substrate structure except for the corners so that the frame body has extending portions extended from the four corners of the frame body to the four corners of the substrate structure.

* * * * *